United States Patent
Stendardo et al.

(10) Patent No.: US 6,365,826 B1
(45) Date of Patent: *Apr. 2, 2002

(54) WATERPROOF ENCLOSURE FOR ELECTRICAL DEVICES

(75) Inventors: Richard J. Stendardo, Durham, NC (US); William W. Kerr, Jr., Clarksville, TN (US); Melanie A. Lewis, Durham; Thomas F. Vrnak, Chapel Hill, both of NC (US); Genaro Flores Alba, Saltillo Coah (MX)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/471,045

(22) Filed: Dec. 22, 1999

(51) Int. Cl.[7] .................................................. H05K 5/00
(52) U.S. Cl. .................. 174/17 VA; 174/50; 174/17 R
(58) Field of Search ......................... 174/17 R, 17 VA, 174/48, 50, 56, 58, 63, 57, 16.1; 52/199, 57, 302.3; 454/365

(56) References Cited

U.S. PATENT DOCUMENTS

| | | | | |
|---|---|---|---|---|
| 2,774,808 A | * | 12/1956 | Bullock | 174/16.1 |
| 3,900,700 A | * | 8/1975 | Gaudet | 174/17 VA |
| 6,067,223 A | * | 5/2000 | Diebel et al. | 174/16.1 |
| 6,088,225 A | * | 7/2000 | Parry et al. | 174/16.1 |
| 6,128,870 A | * | 10/2000 | Kohler | 52/199 |

FOREIGN PATENT DOCUMENTS

| | | | | |
|---|---|---|---|---|
| DE | 3820107 A1 | * | 12/1989 | 52/199 |
| JP | 06204667 A | * | 1/1993 | 174/52.1 |

* cited by examiner

Primary Examiner—Dean A. Reichard
Assistant Examiner—Angel R. Estrada
(74) Attorney, Agent, or Firm—Cantor Colburn LLP

(57) ABSTRACT

A waterproof enclosure (100) for electrical devices includes a front frame (114), a base plate (116), and a roof assembly (118) attached to a component mounting section (120). Front frame (114) extends from the front of component mounting section (120), and includes doors (122) for protecting electrical components mounted within the component mounting section (120). Roof assembly (118) is attached to the top of front frame (114) and component mounting section (120) for preventing the ingress moisture into front frame (114) and component mounting section (120). Roof assembly (118) includes ventilation channels (124, 126, 128, 130) disposed along the length of caps (132, 134, 136) to increase air flow through the enclosure (100) for cooling the electrical components mounted therein.

23 Claims, 6 Drawing Sheets

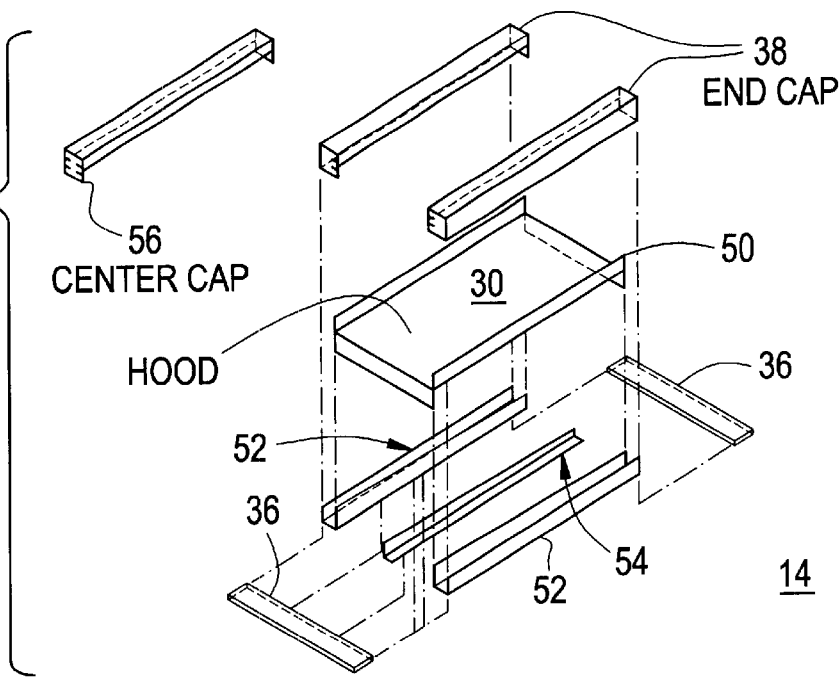
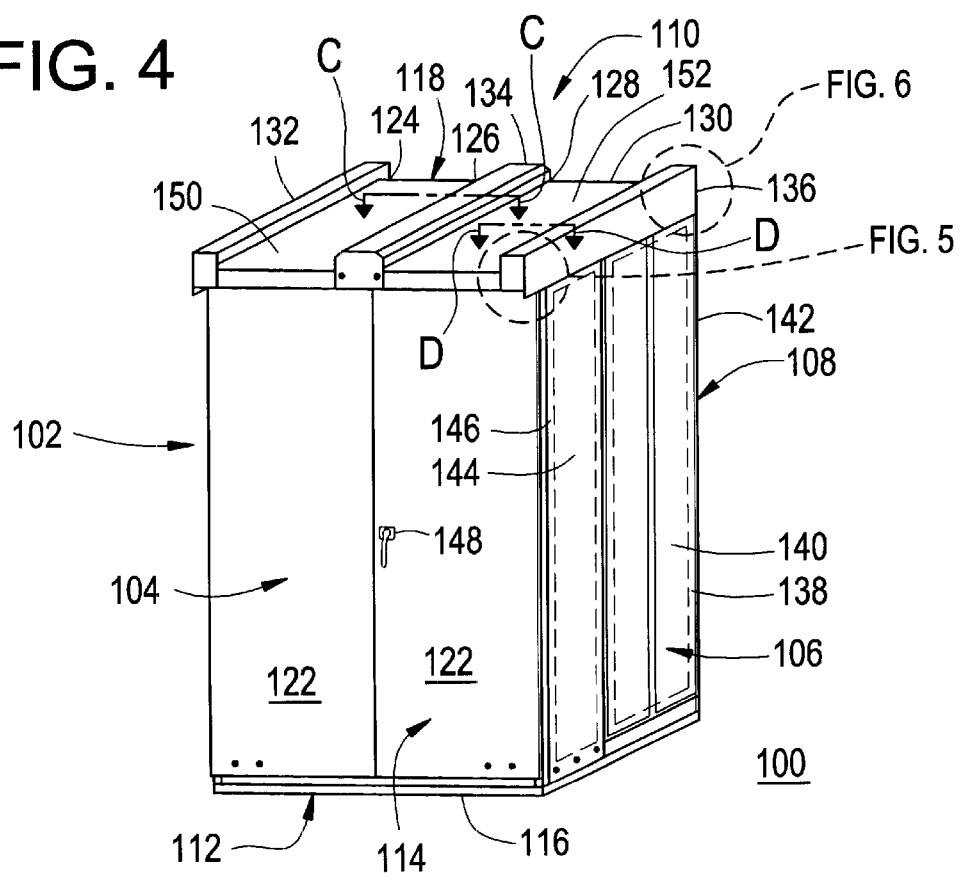

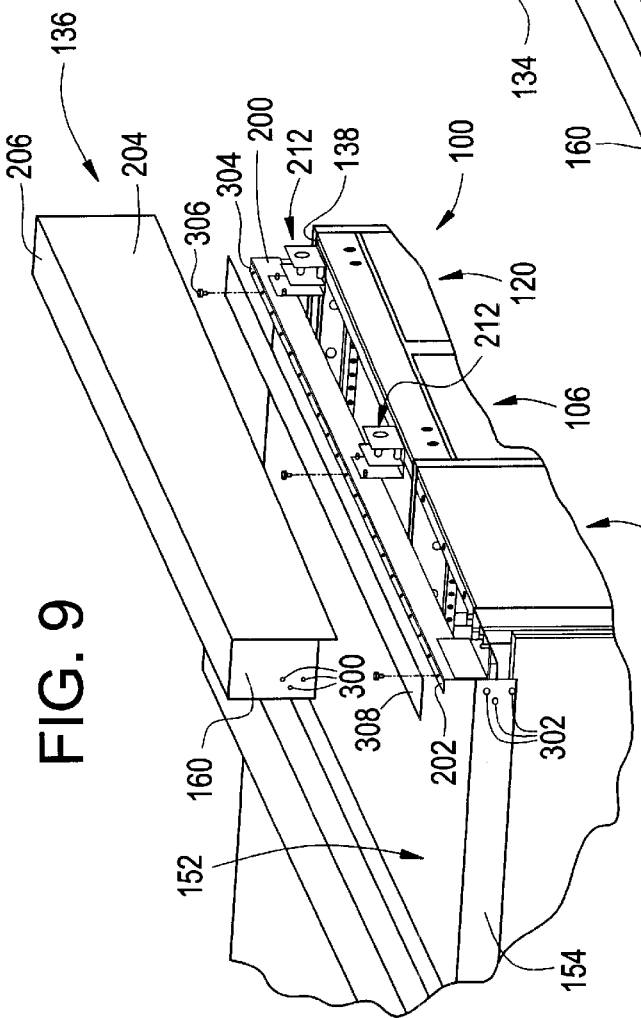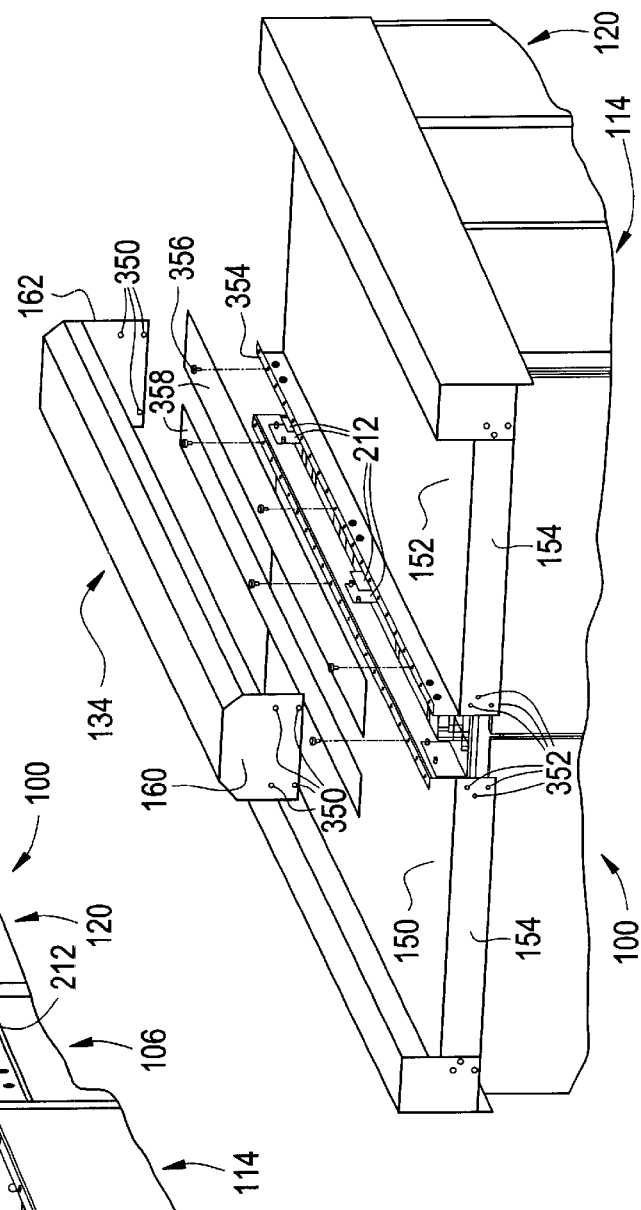

WATERPROOF ENCLOSURE FOR ELECTRICAL DEVICES

BACKGROUND OF THE INVENTION

This invention relates generally to enclosures for electrical components and, more particularly, to a waterproof enclosure for electrical devices.

Enclosures are used in electrical power distribution systems to house various electrical components. These enclosures protect the electrical distribution equipment mounted therein from damage. Such applications include electrical switchboards, switchgear, and motor control centers. The degree of protection provided by the enclosure is dictated by the area in which the enclosure is to be located. The National Electrical Manufacturer's Association (NEMA) defines different types of enclosures by the location of the enclosure and the various elements that the enclosure must be able to withstand. For example, NEMA Type 3 enclosures are for outdoor use, and NEMA Type 3R must provide a degree of protection agains falling rain, sleet, and external ice formation. Enclosures may also be designed to meet waterproof ratings as listed in Underwriters Laboratories standard 891 section 35 and ANSI/IEEE standard C37.20.3-1987 Section 5.2.9.

A typical outdoor enclosure (e.g., NEMA Type 3R) is shown in FIGS. 1 and 2. The switchboard type enclosure 10 includes a front frame 12 and a roof assembly 14 attached to a switchboard section 16. Switchboard section 16 is an indoor type enclosure (e.g., NEMA Type 1 and 2), which includes a metal cover secured to a frame 18 and forming side covers 20 and back cover 22. Mounted within switchboard section 16 are a plurality of electrical devices such as circuit breakers, fusible switches, motor controllers, or other electrical components (not shown). Front frame 12 is attached to the perimeter of the switchboard section 16. Front frame 12 includes walls 24 extending forward from side covers 20, and a door 26. Walls 24 and door 26 protect the electrical components within switchboard section 16 from the elements, while door 26 allows personnel to access these electrical devices. A handle 28 with provisions for a padlock prevent unauthorized access to the electrical devices. Roof assembly 14 includes a sloped hood 30 that extends across the width of switchboard section 16 from side 20 to side 20. Hood 30 extends a distance (shown here as five inches) past the back cover 22 of switchboard section 16 and past the front of door 26. Front and rear edges of hood 30 include flanges 32, 34 that extend downwardly. Secured between flange 32 and front frame 12 and between flange 34 and rear frame 16 are a pair of screen vents 36, which both extends across the width of hood 30. Typically, the screen vents 36 are formed of wire or foam filters to keep out water, debris, and insects. A pair of caps 38 are disposed along the edges of hood 30 adjacent sides 20, 24.

An exploded view of roof assembly 14 is shown in FIG. 3. Referring to FIGS. 2 and 3, hood 30 includes mounting flanges 50 which extend along sides of hood 30. Flanges 50 of hood are secured to lifting brackets 52. Lifting brackets 52 are secured to the frame 18 of switchboard section 16 and extend along the entire length of hood 30. Lifting brackets 52 provide a lifting point on enclosure 10 if it is necessary to move enclosure 10. Once enclosure 10 is in position, caps 38 are secured to flanges 50. An optional center lifting bracket 54 and center cap 56 are shown for use with switchboard sections 16 having a portion of the frame 18 extending through the center of the switchboard section 16.

The enclosure 10 shown in FIGS. 1–3 uses front and rear overhangs, formed by the extension of roof assembly 14 past back cover 22 and front of door 26, to vent heat from the electrical devices mounted within the enclosure. However, the rear overhang increases the area the customer must allocate to the equipment by adding, for example, five inches of depth between the back cover 22 of the equipment and any any object next to which one would place it.

In applications of the enclosure 10 of FIGS. 1–3, if a rear overhang cannot be used, the entire roof assembly must be shifted so that the flange 34 on the rear of hood 30 is flush with the back cover 22. However, this modification eliminates the convective flow of air through the enclosure 10. Indeed, in enclosures 10 where such a modification is made, the ampere rating of the enclosure must be reduced. In addition, this modification increases the amount of overhang on the front of the enclosure 10.

It is therefore desirable to provide an enclosure for electrical components having reduced space requirements through removal of the rear overhang, while providing sufficient ventilation to prevent overheating of the internal electrical components, and while meeting waterproof ratings listed in Underwriters Laboratories standard 891 section 35 and ANSI/IEEE standard C37.20.3-1987 Section 5.2.9.

BRIEF SUMMARY OF THE INVENTION

In an exemplary embodiment of the invention, a roof assembly forms the top of an enclosure for electrical devices. The roof assembly includes a hood formed from a sheet of waterproof material. The hood extends across a portion of the top of the enclosure. A cap extends above a portion of the hood, and a channel extends between the cap and the hood. The channel allows the passage of air into and out of the enclosure.

BRIEF DESCRIPTION OF THE DRAWINGS

FIG. 3 is an exploded perspective view of the roof assembly of FIG. 1;

FIG. 4 is a perspective view of an enclosure of the present invention;

FIG. 9 is an exploded perspective view of an side cap of the enclosure of FIG. 4;

FIG. 10 is an exploded perspective view of a center cap of the enclosure of FIG. 4.

DETAILED DESCRIPTION OF THE INVENTION

Figure 2:
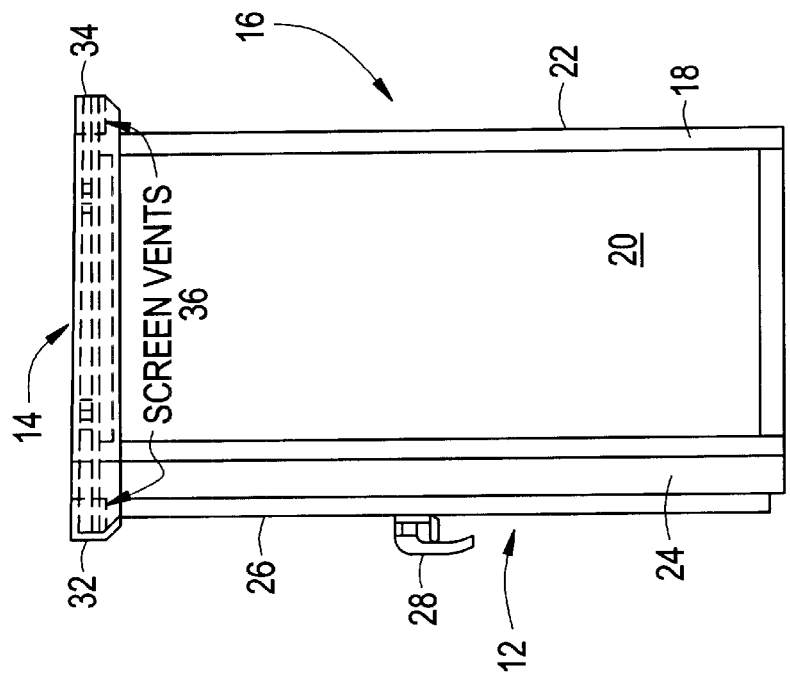
FIG. 2 is a side view of the enclosure of FIG. 1.

FIG. 4 is a perspective view of a waterproof enclosure of the present invention, generally shown at 100. The enclosure 100 is shaped substantially as a rectangular prism having four sides 102, 104, 106, 108, a top 110, and a bottom 112.

The enclosure 100 includes a front frame 114, a base plate 116, and a roof assembly 118 attached to a component mounting section 120. Front frame 1 14 extends from the front of component mounting section 120, and includes doors 122 for protecting electrical components (not shown) mounted within the component mounting section 120. Front frame 114 and component mounting section 120 are secured to substantially rectangular base plate 116, which forms the bottom 112 of enclosure 100. Roof assembly 118 is attached to the top of front frame 114 and component mounting section 120 for preventing the ingress moisture into front frame 114 and component mounting section 120. Roof assembly 118 includes ventilation channels 124, 126, 128, 130 disposed along the length of caps 132, 134, 136 to increase air flow through the enclosure 100 for cooling the electrical components mounted therein, as is described in further detail hereinafter.

Component mounting section 120 includes an internal frame 138 with side panels 140 and a back panel 142 attached to the frame 138. Back panel 142 is a substantially rectangular plate extending the entire height and width of the enclosure 100 to form the back side 108 of the enclosure 100. Side panels 140 are substantially rectangular plates that extend perpendicularly from the side edges of back panel 142 to form a portion of sides 102, 106 of the enclosure 100. Mounted within component mounting section 120 are a plurality of electrical devices (not shown) such as circuit breakers, fusible switches, motor controllers, or other electrical devices. The electrical devices are electrically connected to an electrical distribution circuit (not shown), a portion of which passes into enclosure 100 via holes (not shown) in the back panel 142 or base plate 116. Component mounting section 120 may comprise, for example, a switchboard, switchgear, or motor control mounting cabinet.

Front frame 114 includes walls 144 which extend forward from, and substantially parallel to, side panels 140 of the component mounting section 120. Walls 144 and side plates 140 form sides 102, 106 of the enclosure 100. Doors 122 are hingedly attached to walls 144, and form the front side 104 of the enclosure 100. An internal frame 146 provides support to walls 144 and doors 122. Walls 144 and doors 122 protect the electrical components mounted within the component mounting section 120 from the elements, while doors 122 allow personnel to access these electrical devices. A handle 148 with provisions for a padlock prevent unauthorized access to the electrical devices.

Roof assembly 118 forms the top 110 of enclosure 100. Roof assembly 118 includes side caps 132, 136 and center cap 134 that extend substantially parallel to sides 102, 106 along top 110. Roof assembly 118 further includes hoods 150, 152. Hood 150 extends between caps 132 and 134, along the length of these caps. Similarly, hood 152 extends between caps 134 and 136, and along the length of these caps. Hoods 150 and 152 may be sloped from front 104 to the back 108 of the enclosure 100 to allow any moisture which may collect on hoods 150 and 152 to drain off of the enclosure 100. Caps 132, 134, 136, and hoods 150, 152 are constructed of a waterproof material such as steel or plastic.

Figure 5:
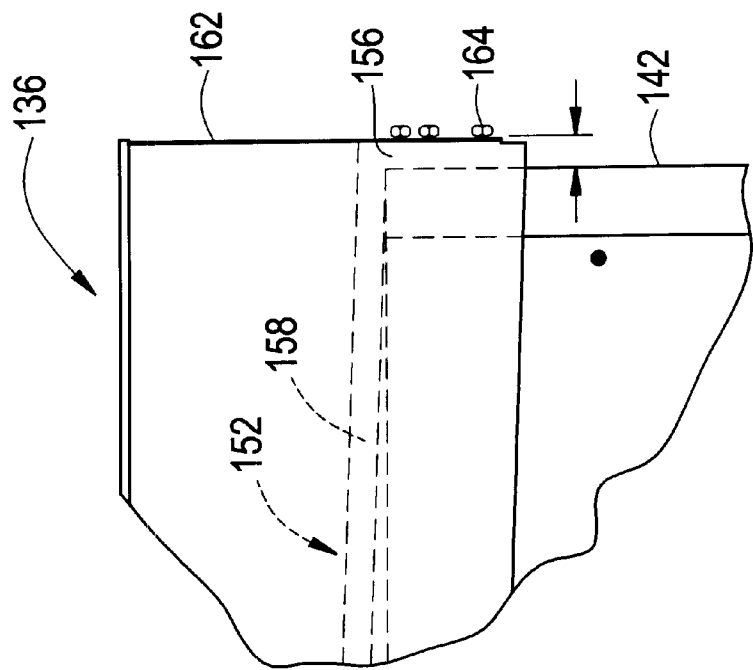
FIG. 5 is a side view of detail "A" of the enclosure of FIG. 4.
Figure 6:
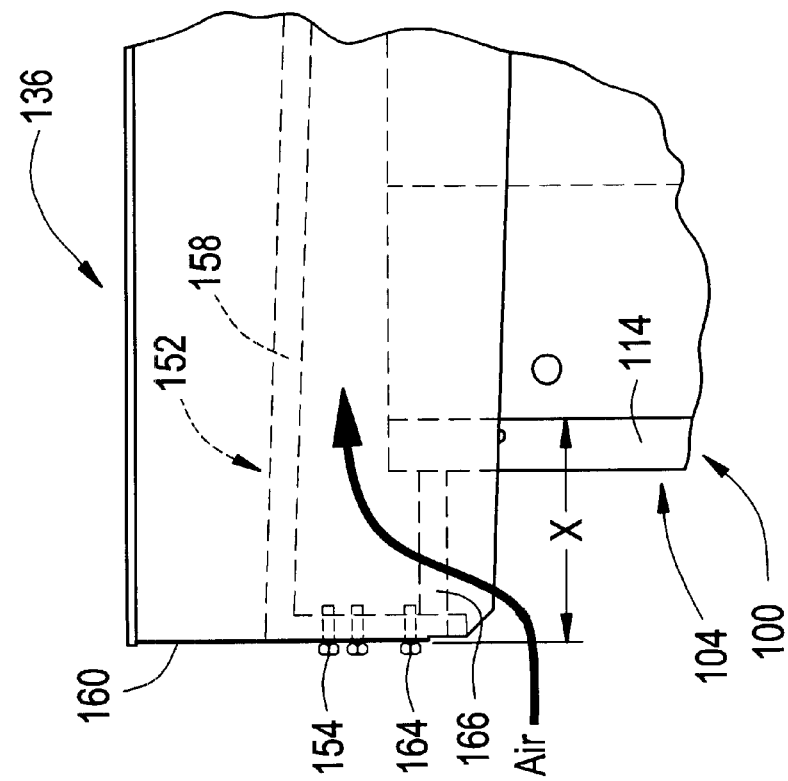
FIG. 6 is a side view of detail "B" of the enclosure of FIG. 4.

FIGS. 5 and 6 show side views of detail "A" and detail "B" in FIG. 4. While hood 152 and side cap 136 are shown, this arrangement is typical for hood 150 and caps 132, 134 as well. Hood 152 includes fornt and back flanges 154, 156 that extend downward from a top surface 158. Flanges 154, 156 are connected to end portions 160, 162 of cap 136 by bolts 164 or similar means. As shown in FIG. 5, cap 136 and hood 152 extend a distance "X" (e.g., five inches) past the front side 104 of enclosure 100. As in the prior art, this overhang provides a ventilation duct between the hood 152 and the front frame 114 for allowing air to flow into the enclosure 100. A screen vent 166, formed of wire or foam filters, is disposed between the front flang 154 and the front frame 114 to keep out water, debris, and insects. Referring to FIG. 6, it can be seen that back flange 156 of hood 152 is secured against the back panel 142, with end portion 162 of cap 136 secured against back flange 156 using bolts 164 or similar means. With the exception of the thickness of the thickness of flange 156, end portion 162, and bolts 164, which protrude a distance (e.g., ½ inch) from back panel 142, there is no overhung in the back of enclosure 100.

Figure 1:
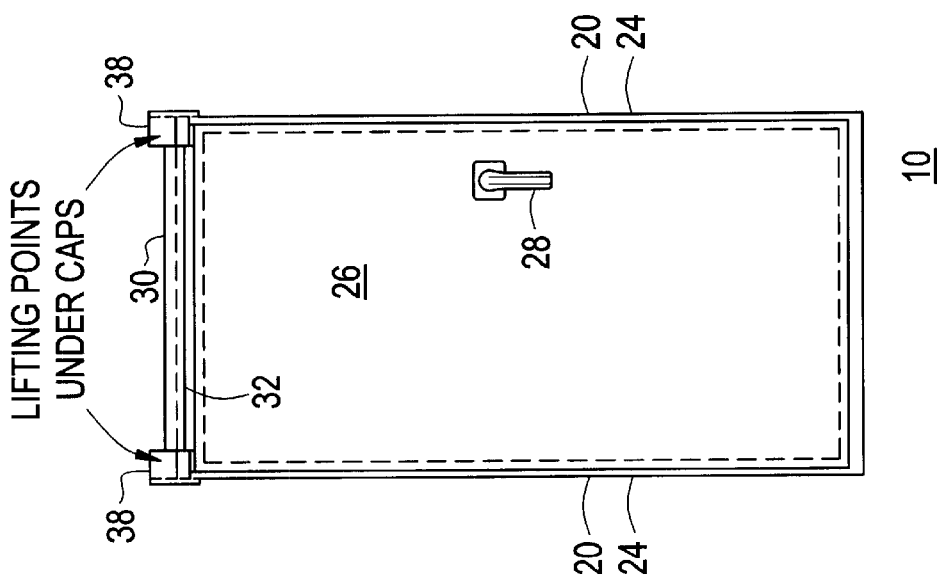
FIG. 1 is a front view of an enclosure of the prior art.
Figure 7:
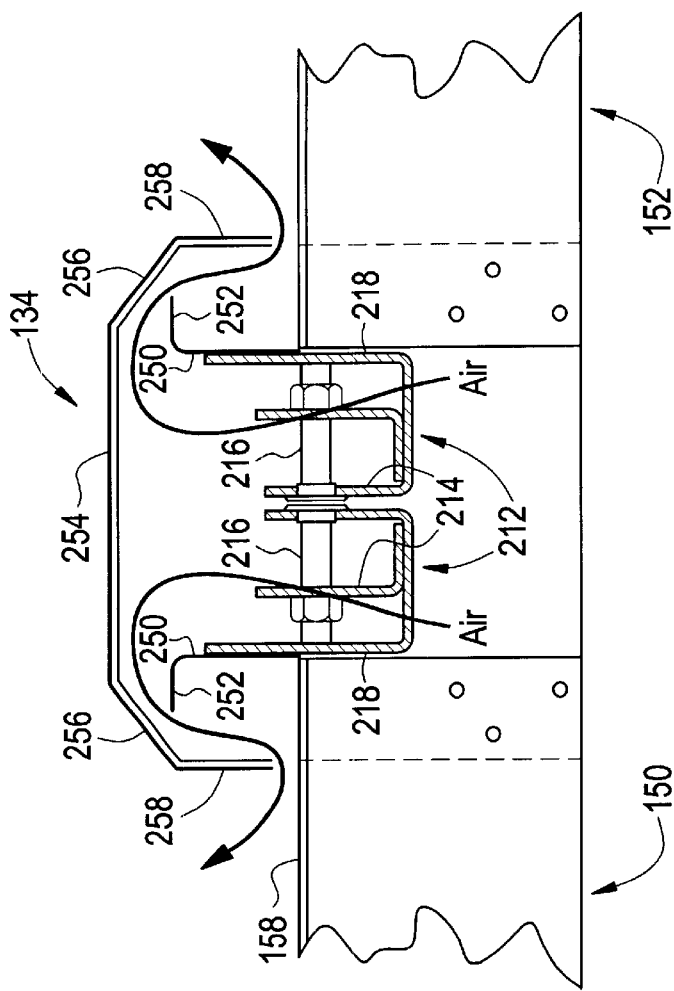
FIG. 7 is a front view of section "D—D" of the enclosure of FIG. 4.
Figure 8:
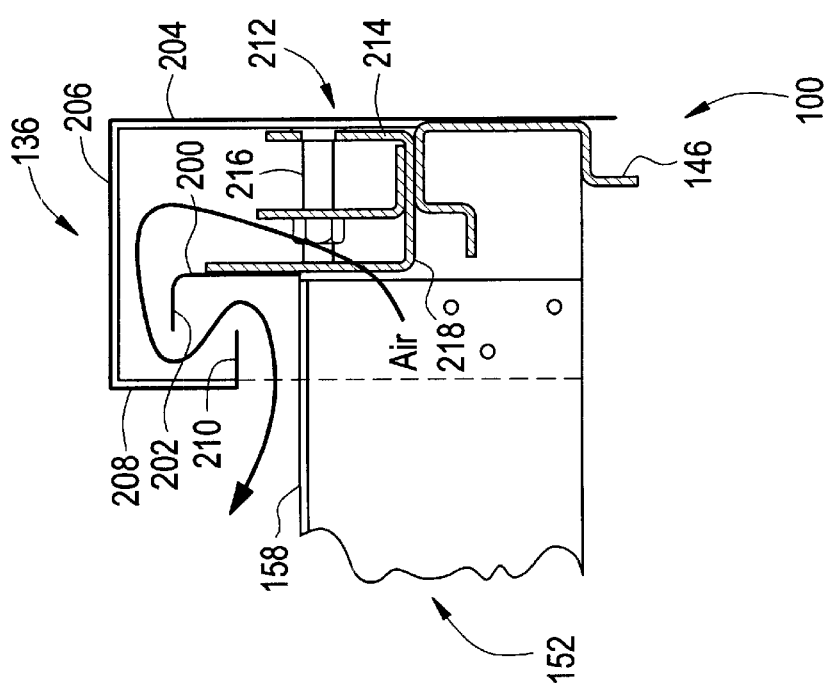
FIG. 8 is a front view of section "C—C" of the enclosure of FIG. 4.

Referring now to FIG. 7, a front view of section "D—D" of the enclosure 100 of FIG. 4 is shown. While hood 152 and side cap 136 are shown, this arrangement is typical for hood 150 and side cap 132 as well. Hood 152 includes a side flange 200 extending along the side edge of top surface 158 and substantially perpendicular thereto. A lip 202 extends perpendicularly from a free edge of side flange 200. Side cap 136 includes a side surface 204, which extends parallel to, and in intamate contact with, frame 146 of front frame 114. Side cap 136 also includes a top surface 206, extending perpendicularly from side surface 204, and a flange 208, which extends from top surface 206 in a direction substantially parallel to side surface 204. A lip 210 extends perpendicularly from a free edge of flange 208. Channel 130 is formed between lip 210 and top surface 158, lip 210 and lip 202, and lip 202 and top surface 206. Channel 130 extends along the entire length of side cap 136, from back side 108 of enclosure 100 to front side 104 of enclosure 100 (see FIG. 1). Channel 130 allows the exhaust of warm air from the enclosure 100. The ingress of moisture is prevented by the tortuous path created for the air flow, with lips 202 and 210 preventing drops of water bouncing off of hood 152 from entering enclosure 100.

A lifting lug 212 is secured to frame 138 of component mounting portion 120 (see FIG. 1) by welding or similar process. Lifting lug 212 includes a u-shaped bracket 214 with a bolt 216 extending from one side of the u-shaped bracket 214 to the other. Lifting lug 212 provides a lifting point on enclosure 100 if it is necessary to move enclosure 100. Lifting lug 212 also includes an L-shaped extension 218 depending from the bottom of the u-shaped bracket 214 and extending upward therefrom to contact side flange 200 of hood 152. Side flange 200 of hood 152 is secured to L-shaped extension 218 by bolts or similar means.

A pair of lifting lugs 212 are secured to frame of component mounting portion by welding or similar process. Side flanges 250 of hoods 150, 152 are secured to L-shaped extensions 218 of lifting lugs 212 by bolts or similar means.

Referring to FIG. 9, an exploded perspective view of side cap 136 is shown. While hood 152 and side cap 136 are shown, this arrangement is typical for hood 150 and side cap 132 as well. Holes 300 in end portion 160 of cap 136 align with holes 302 in front flange 154 of hood 152, for accepting bolts 164 (FIG. 5) to secure cap 136 to hood 152. Holes 304 in lip 202 of hood 152 accept screws 306 for securing a screen vent 308, formed of wire or foam filters, thereto. Screen vent 308 helps to keep water, debris, and insects from entering the channel formed between cap 136 and hood 152. A pair of lifting lugs 212 are secured to frame 138 of component mounting portion 120 and to side flange 200 of hood 152. As can be seen, lifting lugs 212 extend along only a small portion of side 106. Therefore, lifting lugs 212 obstruct only a small portion of the channel formed between cap 136 and hood 152.

Figure 11:
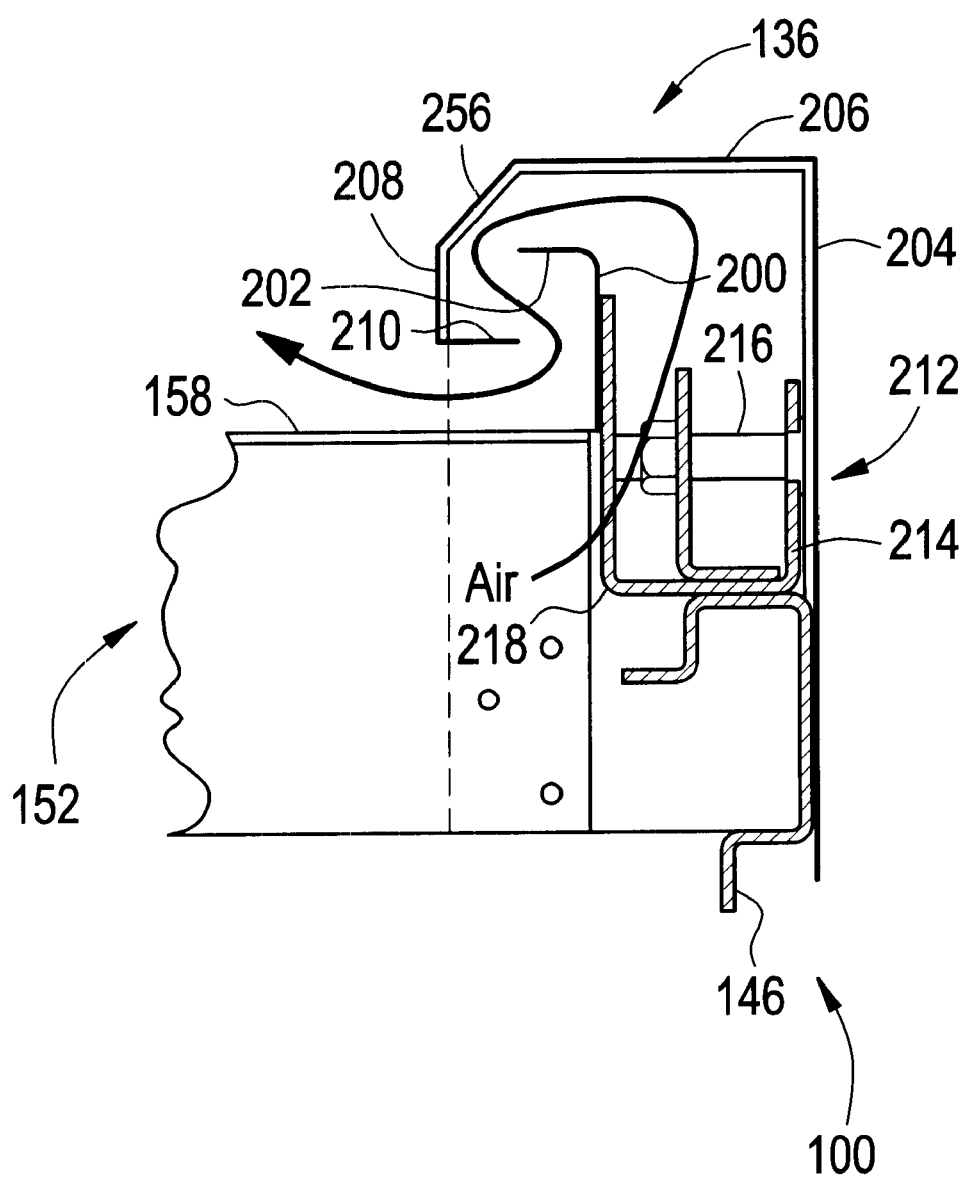
FIG. 11 is a front view of an alternative embodiment of a cap in FIG. 7.

Referring now to FIG. 11, an alternative exemplary embodiment of section "D—D" of the enclosure 100 of FIG. 4 is shown. Hood 152 includes a side flange 200 extending along the side edge of top surface 158 and substantially perpendicular thereto. A lip 202 extends perpendicularly from a free edge of side flange 200. Side cap 136 includes a side surface 204, which extends parallel to, and in intimate contact with, frame 146 of front frame 114. Side cap 136 also includes a top surface 206, extending perpendicularly from side surface 204, and an eave 256, which extends at a downward angle from top surface 206. The eave 256 forms an obtuse angle, relative to top surface 206, as it extends from top surface 206. A flange 208 extends from eave 256 in a direction substantially parallel to side surface 204. A lip 210 extends perpendicularly from a free edge of flange 208. Channel 130 is formed between lip 210 and top surface 158, lip 210 and lip 202, and lip 202 and top surface 206. Channel 130 extends along the entire length of side cap 136, from back side 108 of enclosure 100 to front side 104 of enclosure 100 (see FIG. 1). Channel 130 allows the exhaust of warm air from the enclosure 100. The ingress of moisture is prevented by the tortuous path created for the air flow, with lips 202 and 210 preventing drops of water bouncing off of hood 152 from entering enclosure 100.

Referring to FIG. 10, an exploded perspective view of center cap 134 is shown. Holes 350 in end portion 160 of cap 134 align with holes 352 in front flanges 154 of hoods 150, 152, for accepting bolts 164 (FIG. 5) to secure cap 134 to hoods 150, 152. Holes 354 in lips 252 of hoods 150, 152 accept screws 356 for securing a screen vents 358, formed of wire of foam filters, thereto. Screen vents 358 helps to keep water, debris, and insects from entering the channels formed between center cap 134 and hoods 150, 152. Lifting lugs 212 are secured to frame 138 of component mounting portion 120 and to side flanges 250 of hoods 150, 152. Lifting lugs 212 extend along only a small portion of the space between hoods 150, 152. Therefore, lifting lugs 212 obstruct only a small portion of the channels formed between hoods 150, 152 and cap 134.

The waterproof enclosure of the present invention, by removing the need for a rear overhang, reduces space requirements from those required for prior art enclosures. The waterproof enclosure described herein uses ventilation channels disposed along the length of caps to increase air flow through the enclosure for cooling the electrical components mounted therein. With the ventilation channels described herein, a chimney effect is created, allowing heated air rising off the equipment to exit through the channels. These channels have been shown to provide improved ventilation over the prior art design. This design has also been shown to meet waterproof ratings listed in Underwriters Laboratories standard 891 section 35 and ANSI/IEEE standard C37.20.3-1987 Section 5.2.9.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, is intended that the invention not be limited to the particular embodiment disclosed as the best mode contemplated for carrying out this invention, but that the invention will include all embodiments falling within the scope of the appended claims.

What is claimed is:

1. A roof assembly forming the top of an enclosure for electrical devices, the roof assembly including:
    a first hood formed from a sheet of waterproof material, said first hood extending across a portion of the top of the enclosure;
    a cap extending above a portion of said first hood; and
    a first channel extending between said cap and said first hood, said first channel allowing the passage of air into and out of the enclosure, wherein said first hood includes
    a first flange extending upward from a first edge formed on said first hood; and
    wherein said cap includes
    a top portion extending above said first flange,
    a first eave extending at a downward angle from a side edge of said top portion, and
    a lip extending downward from a side edge of said first eave, said first channel extending between said first hood and said lip.

2. The roof assembly of claim 1, wherein said first flange includes
    a first lip disposed along a free edge of said first flange, said first lip extending above said first hood, and said first channel extending between said first lip and said lip.

3. The roof assembly of claim 1, wherein said cap further extends above a lifting lug attached to a frame of the enclosure.

4. The roof assembly of claim 1, further including a screen vent attached between said cap and said first hood for preventing objects from entering said enclosure.

5. The roof assembly of claim 1, wherein said first hood, said cap, and said channel extend along an entire length of the roof assembly.

6. The roof assembly of claim 1, further including:
    a second hood formed from a sheet of waterproof material, said second hood extending across another portion of the top of the enclosure, said cap extending above a portion of said second hood, and
    a second channel extending between said cap and said second hood, said second channel allowing the passage of air into and out of the enclosure.

7. The roof assembly of claim 6, further including:
    a third flange extending upward from a second edge formed on said second hood;
and wherein said cap includes
    said top portion extending above said first and third flanges,
    a second eave extending downward from another side edge of said top portion, and
    a second lip extending downward from a side edge of said second eave, said second eave disposed between said top portion and said second lip, said second channel extending between said third flange and said second lip.

8. The roof assembly of claim 6, further including:
    a first screen vent attached between said cap and said first hood; and
    a second screen vent attached between said cap and said second hood, said first and second screen vents for preventing objects from entering the enclosure.

9. The roof assembly of claim 6, wherein said first and second hoods, said cap, and said first and second channels extend along an entire length of the roof assembly.

10. The roof assembly of claim 6, wherein said cap further extends above a lifting lug disposed between said first and second hoods.

11. A waterproof enclosure for electrical devices, the waterproof enclosure comprising:
- a component mounting section having a rear panel and side panels, said rear panel and said side panels forming a compartment for mounting electrical devices;
- a front frame having side walls and a door, said side walls extending from said side panels and said door extending between said side walls;
- a roof assembly forming a top of the enclosure, the roof assembly including:
  - a first hood formed from a sheet of waterproof material, said first hood extending across a portion of the top of the enclosure;
  - a cap extending above a portion of said first hood, and
  - a first channel extending between said cap and said first hood, said first channel allowing the passage of air into and out of the enclosure, wherein said hood includes
    - a first flange extending upward from an edge formed on said first hood; and
  - wherein said cap includes
    - a top portion extending above said first flange,
    - a first eave extending at a downward angle from a side edge of said top portion, and
    - a lip extending downward from a side edge of said first eave, said first eave disposed between said top portion and said lip, said first channel extending between said first flange and said lip.

12. The waterproof enclosure of claim 11, wherein the enclosure is shaped substantially as a rectangular prism having first, second, third, and fourth sides, a bottom and said top; said first side being formed by said rear panel, said second side being formed by one of said side panels and one of said side walls, said third side being partially formed by said door, and said fourth side being formed by another of said side panels and another of said side walls.

13. The roof assembly of claim 11, wherein said first flange includes a first lip disposed along a free edge of said first flange, said first lip extending above said hood.

14. The roof assembly of claim 11, wherein said cap further extends above a lifting lug attached to a frame of the enclosure.

15. The roof assembly of claim 11, further including a screen vent attached between said cap and said first hood for preventing objects from entering said enclosure.

16. The roof assembly of claim 11 wherein said first hood, said cap, and said channel extend along an entire length of the roof assembly.

17. The roof assembly of claim 11, further including:
- a second hood formed from a sheet of waterproof material, said second hood extending across another portion of the top of the enclosure, said cap extending above a portion of said second hood, and
- a second channel extending between said cap and said second hood, said second channel allowing the passage of air into and out of the enclosure.

18. The roof assembly of claim 17, further including:
- a third flange extending upward from a second edge formed on said second hood;
- and wherein said cap includes
  - said top portion extending above said first and third flanges,
  - a second eave extending downward from another side edge of said top portion, and
  - a second lip extending downward from a side edge of said second eave, said second eave disposed between said top portion and said second lip, said second channel extending between said third flange and said second lip.

19. The roof assembly of claim 17, further including:
- a first screen vent attached between said cap and said first hood; and
- a second screen vent attached between said cap and said second hood, said first and second screen vents for preventing objects from entering said enclosure.

20. The roof assembly of claim 17, wherein said first and second hoods, said cap, and said first and second channels extend along an entire length of the roof assembly.

21. The roof assembly of claim 17, wherein said cap further extends above a lifting lug disposed between said first and second hoods.

22. A waterproof enclosure for electrical devices, the waterproof enclosure comprising:
- a component mounting section having a rear panel and side panels, said rear panel and said side panels forming a compartment for mounting electrical devices;
- a roof assembly forming a top of said compartment, the roof assembly including:
  - a first hood formed from a sheet of waterproof material, said first hood extending across a portion of the top of the enclosure, said first hood includes
    - a first flange extending upward from an edge formed on a first portion of said first hood; and
    - a third flange extending upward from an edge formed on a second portion of said first hood,
  - a second hood formed from a sheet of waterproof material, said second hood extending across a portion of the top of said compartment; said second hood includes
    - a fifth flange extending upward from a second edge formed on a second portion of said second hood,
  - a first cap extending above said first portion of said first hood, said first cap comprising
    - a first top portion extending above said first flange, and
    - a second flange extending downward from a side edge of said first top portion, said first and second flanges forming a first channel allowing the passage of air into and out of the enclosure,
  - a second cap extending above said second portion of said first hood and a first portion of said second hood, said second cap comprises
    - a second top portion extending above said third flange,
    - an eave extending at a downward angle from a side edge of said second top portion, and
    - a lip extending downward from a side edge of said eave, said third flange and said lip forming a second channel allowing passage of air into and out of the enclosure,
  - a third cap extending above said second portion of said second hood, said third cap comprises
    - a third top portion extending above said fifth flange, and
    - a sixth flange extending downward from a side edge of said third top portion, said fifth and sixth flanges forming a third channel allowing passage of air into and out of the enclosure.

23. A waterproof enclosure for electrical devices, the waterproof enclosure comprising:
- a component mounting section having a rear panel and side panels, said rear panel and said side panels forming a compartment for mounting electrical devices;

a roof assembly forming a top of said compartment, the roof assembly including:
  a first hood formed from a sheet of waterproof material, said first hood extending across a portion of the top of the enclosure, said first hood includes
    a first flange extending upward from an edge formed on a first portion of said first hood; and
    a third flange extending upward from an edge formed on a second portion of said first hood,
  a second hood formed from a sheet of waterproof material, said second hood extending across a portion of the top of said compartment; said second hood includes
    a fifth flange extending upward from a second edge formed on a second portion of said second hood,
  a first cap extending above said first portion of said first hood, said first cap comprising
    a first top portion extending above said first flange,
    a first eave extending at a downward angle from a side edge of said first top portion, and
    a second flange extending downward from a side edge of said first eave, said first and second flanges forming a first channel allowing the passage of air into and out of the enclosure,
  a second cap extending above said second portion of said first hood and a first portion of said second hood, said second cap comprises
    a second top portion extending above said third flange,
    a second eave extending at a downward angle from a side edge of said second top portion, and
    a lip extending downward from a side edge of said second eave, said third flange and said lip forming a second channel allowing passage of air into and out of the enclosure,
  a third cap extending above said second portion of said second hood, said third cap comprises
    a third top portion extending above said fifth flange,
    a third cave extending at a downward angle from a side edge of said third top portion, and
    a sixth flange extending downward from a side edge of said third eave, said fifth and sixth flanges forming a third channel allowing passage of air into and out of the enclosure.

* * * * *